US012616048B2

(12) United States Patent
Chua et al.

(10) Patent No.: US 12,616,048 B2
(45) Date of Patent: Apr. 28, 2026

(54) SEMICONDUCTOR DEVICE AND METHOD OF FORMING INVERTED EWLB PACKAGE WITH VERTICAL E-BAR STRUCTURE

(71) Applicant: STATS ChipPAC Pte. Ltd., Singapore (SG)

(72) Inventors: Linda Pei Ee Chua, Singapore (SG); Kai Chong Chan, Singapore (SG); Rowena Zarate, Singapore (SG); Marites Roque, Singapore (SG); Yi Jing Eric Chong, Singapore (SG)

(73) Assignee: STATS ChipPAC Pte. Ltd., Singapore (SG)

( * ) Notice: Subject to any disclaimer, the term of this patent is extended or adjusted under 35 U.S.C. 154(b) by 370 days.

(21) Appl. No.: 18/344,920

(22) Filed: Jun. 30, 2023

(65) Prior Publication Data

US 2025/0006608 A1       Jan. 2, 2025

(51) Int. Cl.
| | |
|---|---|
| *H01L 23/498* | (2006.01) |
| *H01L 21/48* | (2006.01) |
| *H01L 21/56* | (2006.01) |
| *H01L 23/00* | (2006.01) |
| *H01L 23/31* | (2006.01) |

(52) U.S. Cl.
CPC .... *H01L 23/49822* (2013.01); *H01L 21/4853* (2013.01); *H01L 21/4857* (2013.01); *H01L 21/565* (2013.01); *H01L 23/3107* (2013.01); *H01L 23/49838* (2013.01);
(Continued)

(58) Field of Classification Search
CPC .......... H01L 23/49822; H01L 21/4853; H01L 21/4857; H01L 21/565; H01L 23/3107;
H01L 23/49838; H01L 24/24; H01L 2224/24155; H01L 2924/182; H01L 21/568; H01L 23/3128; H01L 23/5389; H01L 24/19; H01L 24/29; H01L 24/32; H01L 23/5386; H01L 21/4846; H01L 21/563; H01L 23/31; H01L 23/5283; H01L 23/49811; H01L 24/03; H01L 24/04;
(Continued)

(56) References Cited

U.S. PATENT DOCUMENTS

| | | | |
|---|---|---|---|
| 9,806,040 | B2 | 10/2017 | Liu et al. |
| 10,504,845 | B2 | 12/2019 | Lin |

(Continued)

*Primary Examiner* — Marlon T Fletcher
*Assistant Examiner* — Christina A Sylvia
(74) *Attorney, Agent, or Firm* — Robert D. Atkins; PATENT LAW GROUP: Atkins and Associates, P.C.

(57)       ABSTRACT

A semiconductor device has an electrical component and an e-bar structure disposed to a side of the electrical component. An encapsulant is deposited over the electrical component and e-bar structure. An RDL is formed over the electrical component, encapsulant, and e-bar structure. The e-bar structure has a core layer, a first conductive layer formed over a first surface of the core layer, and a second conductive layer formed over a second surface of the core layer. The second conductive layer includes a thickness greater than the first conductive layer. The RDL has an insulating layer formed over the electrical component and encapsulant, and a conductive layer formed over the insulating layer. A bump is formed over a contact pad of the e-bar structure opposite the RDL. A contact pad of the electrical component is electrically connected to the RDL opposite the bump.

21 Claims, 13 Drawing Sheets

(52) U.S. Cl.
CPC .... *H01L 24/24* (2013.01); *H01L 2224/24155*
(2013.01); *H01L 2924/182* (2013.01)

(58) Field of Classification Search
CPC ... H01L 2224/02381; H01L 2224/0401; H01L
2924/15311
See application file for complete search history.

(56) References Cited

U.S. PATENT DOCUMENTS

| | | | |
|---|---|---|---|
| 10,541,201 B2 | 1/2020 | Lee et al. | |
| 10,629,531 B2 | 4/2020 | Lin | |
| 2014/0103527 A1* | 4/2014 | Marimuthu | H01L 21/486 |
| | | | 257/737 |
| 2020/0185352 A1* | 6/2020 | Lee | H01L 21/76849 |

* cited by examiner

SEMICONDUCTOR DEVICE AND METHOD OF FORMING INVERTED EWLB PACKAGE WITH VERTICAL E-BAR STRUCTURE

FIELD OF THE INVENTION

The present invention relates in general to semiconductor devices and, more particularly, to a semiconductor device and method of forming an inverted eWLB package with vertical e-bar structures.

BACKGROUND OF THE INVENTION

Semiconductor devices are commonly found in modern electrical products. Semiconductor devices perform a wide range of functions, such as signal processing, high-speed calculations, transmitting and receiving electromagnetic signals, controlling electrical devices, photo-electric, and creating visual images for television displays. Semiconductor devices are found in the fields of communications, power conversion, networks, computers, entertainment, and consumer products. Semiconductor devices are also found in military applications, aviation, automotive, industrial controllers, and office equipment.

Semiconductor devices often contain a semiconductor die or substrate with electrical interconnect structures, e.g., redistribution layers (RDL) formed over one or more surfaces of the semiconductor die or substrate to perform necessary electrical functions. A vertical interconnect structure disposed adjacent to the semiconductor die is electrically connected to the RDL and an encapsulant covers the vertical interconnect structure and semiconductor die. The encapsulant and vertical interconnect structure often undergoes a grinding operation to planarize the surfaces. Excessive grinding can reduce the thickness of the vertical interconnect structure, or even remove the contact surface, leading to defects and reduced manufacturing yield.

BRIEF DESCRIPTION OF THE DRAWINGS

FIGS. 2a-21 illustrate a process of forming an e-bar substrate;

FIG. 5 illustrates a printed circuit board (PCB) with different types of packages disposed on a surface of the PCB.

DETAILED DESCRIPTION OF THE DRAWINGS

The present invention is described in one or more embodiments in the following description with reference to the figures, in which like numerals represent the same or similar elements. While the invention is described in terms of the best mode for achieving the invention's objectives, it will be appreciated by those skilled in the art that it is intended to cover alternatives, modifications, and equivalents as may be included within the spirit and scope of the invention as defined by the appended claims and their equivalents as supported by the following disclosure and drawings. The features shown in the figures are not necessarily drawn to scale. Elements having a similar function are assigned the same reference number in the figures. The term "semiconductor die" as used herein refers to both the singular and plural form of the words, and accordingly, can refer to both a single semiconductor device and multiple semiconductor devices.

Semiconductor devices are generally manufactured using two complex manufacturing processes: front-end manufacturing and back-end manufacturing. Front-end manufacturing involves the formation of a plurality of die on the surface of a semiconductor wafer. Each die on the wafer contains active and passive electrical components, which are electrically connected to form functional electrical circuits. Active electrical components, such as transistors and diodes, have the ability to control the flow of electrical current. Passive electrical components, such as capacitors, inductors, and resistors, create a relationship between voltage and current necessary to perform electrical circuit functions.

Back-end manufacturing refers to cutting or singulating the finished wafer into the individual semiconductor die and packaging the semiconductor die for structural support, electrical interconnect, and environmental isolation. To singulate the semiconductor die, the wafer is scored and broken along non-functional regions of the wafer called saw streets or scribes. The wafer is singulated using a laser cutting tool or saw blade. After singulation, the individual semiconductor die are disposed on a package substrate that includes pins or contact pads for interconnection with other system components. Contact pads formed over the semiconductor die are then connected to contact pads within the package. The electrical connections can be made with conductive layers, bumps, stud bumps, conductive paste, or wirebonds. An encapsulant or other molding material is deposited over the package to provide physical support and electrical isolation. The finished package is then inserted into an electrical system and the functionality of the semiconductor device is made available to the other system components.

Figure 1A:
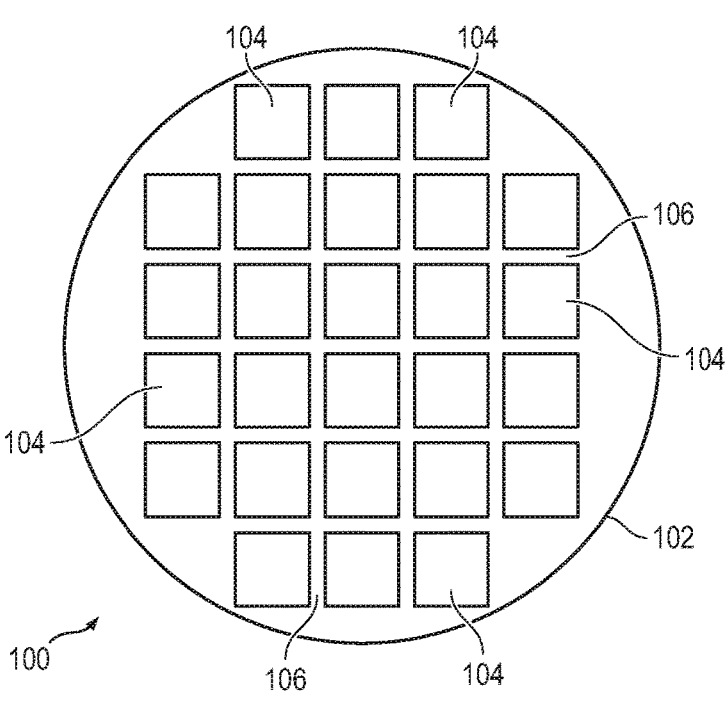
FIGS. 1a-1c illustrate a semiconductor wafer with a plurality of semiconductor die separated by a saw street.

FIG. 1a shows a semiconductor wafer 100 with a base substrate material 102, such as silicon, germanium, aluminum phosphide, aluminum arsenide, gallium arsenide, gallium nitride, indium phosphide, silicon carbide, or other bulk material for structural support. A plurality of semiconductor die or electrical components 104 is formed on wafer 100 separated by a non-active, inter-die wafer area or saw street 106. Saw street 106 provides cutting areas to singulate semiconductor wafer 100 into individual semiconductor die 104. In one embodiment, semiconductor wafer 100 has a width or diameter of 100-450 millimeters (mm).

Figure 1B:
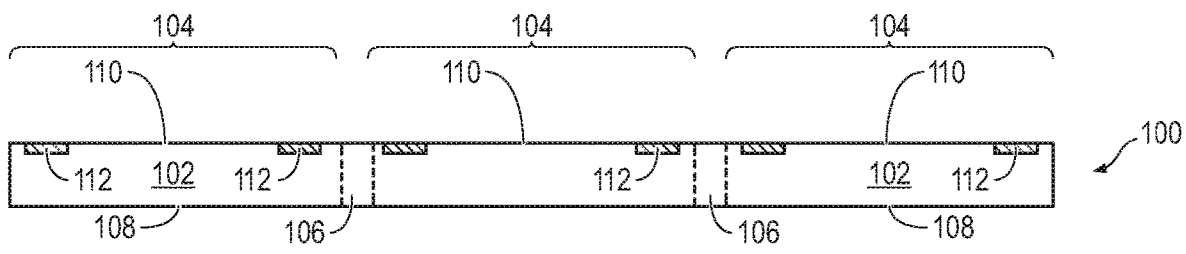

FIG. 1b shows a cross-sectional view of a portion of semiconductor wafer 100. Each semiconductor die 104 has a back or non-active surface 108 and an active surface 110 containing analog or digital circuits implemented as active devices, passive devices, conductive layers, and dielectric layers formed within the die and electrically interconnected according to the electrical design and function of the die. For example, the circuit may include one or more transistors, diodes, and other circuit elements formed within active surface 110 to implement analog circuits or digital circuits, such as digital signal processor (DSP), application specific integrated circuits (ASIC), memory, or other signal processing circuit. Semiconductor die 104 may also contain IPDs, such as inductors, capacitors, and resistors, for RF signal processing.

An electrically conductive layer 112 is formed over active surface 110 using PVD, CVD, electrolytic plating, electroless plating process, or other suitable metal deposition process. Conductive layer 112 can be one or more layers of aluminum (Al), copper (Cu), tin (Sn), nickel (Ni), gold (Au), silver (Ag), or other suitable electrically conductive material. Conductive layer 112 operates as contact pads electrically connected to the circuits on active surface 110.

Figure 1C:
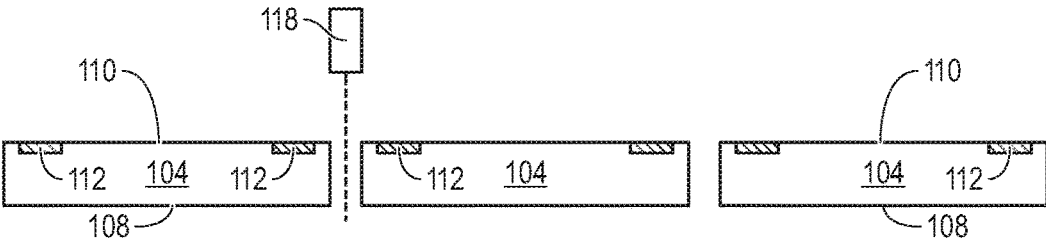

In FIG. 1c, semiconductor wafer 100 is singulated through saw street 106 using a saw blade or laser cutting tool 118 into individual semiconductor die 104. The individual semiconductor die 104 can be inspected and electrically tested for identification of known good die or known good unit (KGD/KGU) post singulation.

Figures 2A, 2B, 2C, 2D:
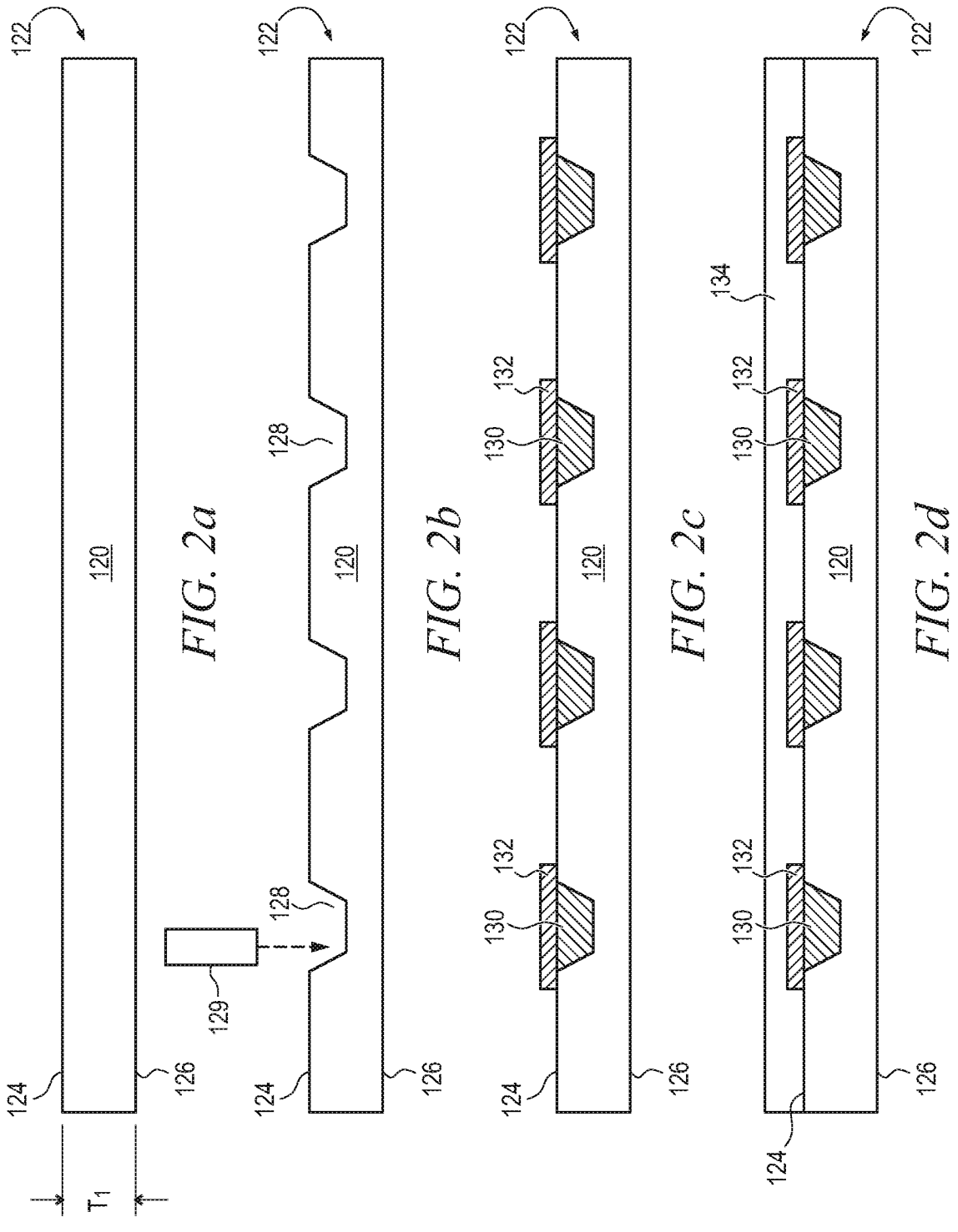

FIG. 2a illustrates a portion of base or core layer 120 for an embedded bar (e-bar) wafer or substrate 122 containing one or more layers of SiO2, Si3N4, SiON, Ta2O5, Al2O3, solder resist, polyimide, BCB, PBO, and other material having similar insulating and structural properties. Core layer 120 can also be a multi-layer flexible laminate, ceramic, copper clad laminate (CCL), glass, or epoxy molding compound. In another embodiment, base core layer 120 can also be any suitable laminate interposer, PCB, waferform, strip interposer, leadframe, or other type of substrate. Core layer 120 may include one or more laminated layers of polytetrafluoroethylene (PTFE) pre-impregnated (prepreg), FR-4, FR-1, CEM-1, or CEM-3 with a combination of phenolic cotton paper, epoxy, resin, woven glass, matte glass, polyester, and other reinforcement fibers or fabrics. Core layer 120 has a thickness T1 of 150.0 micrometers (μm) and includes first major surface 124 and second major surface 126 opposite surface 124.

In FIG. 2b, an opening or via 128 is formed in surface 124 of core layer 120 using an etching process or laser direct ablation (LDA) using laser 129, to a depth of about half of T1.

In FIG. 2c, conductive layer 130 is formed within openings 128 using PVD, CVD, electrolytic plating, electroless plating process, or other suitable metal deposition process. Conductive layer 130 can be one or more layers of Al, Cu, Sn, Ni, Au, Ag, or other suitable electrically conductive material. Portions of conductive layer 130 can be electrically common or electrically isolated depending on the design and function of electrical components attached thereto.

In FIG. 2d, conductive layer 132 is formed over conductive layer 130 and surface 124 of core layer 120 using PVD, CVD, electrolytic plating, electroless plating process, or other suitable metal deposition process. Conductive layer 132 can be one or more layers of Al, Cu, Sn, Ni, Au, Ag, or other suitable electrically conductive material. In one embodiment, conductive layer 132 has a thickness of 24.0±7.0 μm. Portions of conductive layer 132 can be electrically common or electrically isolated depending on the design and function of electrical components attached thereto.

Figures 2E, 2F, 2G:
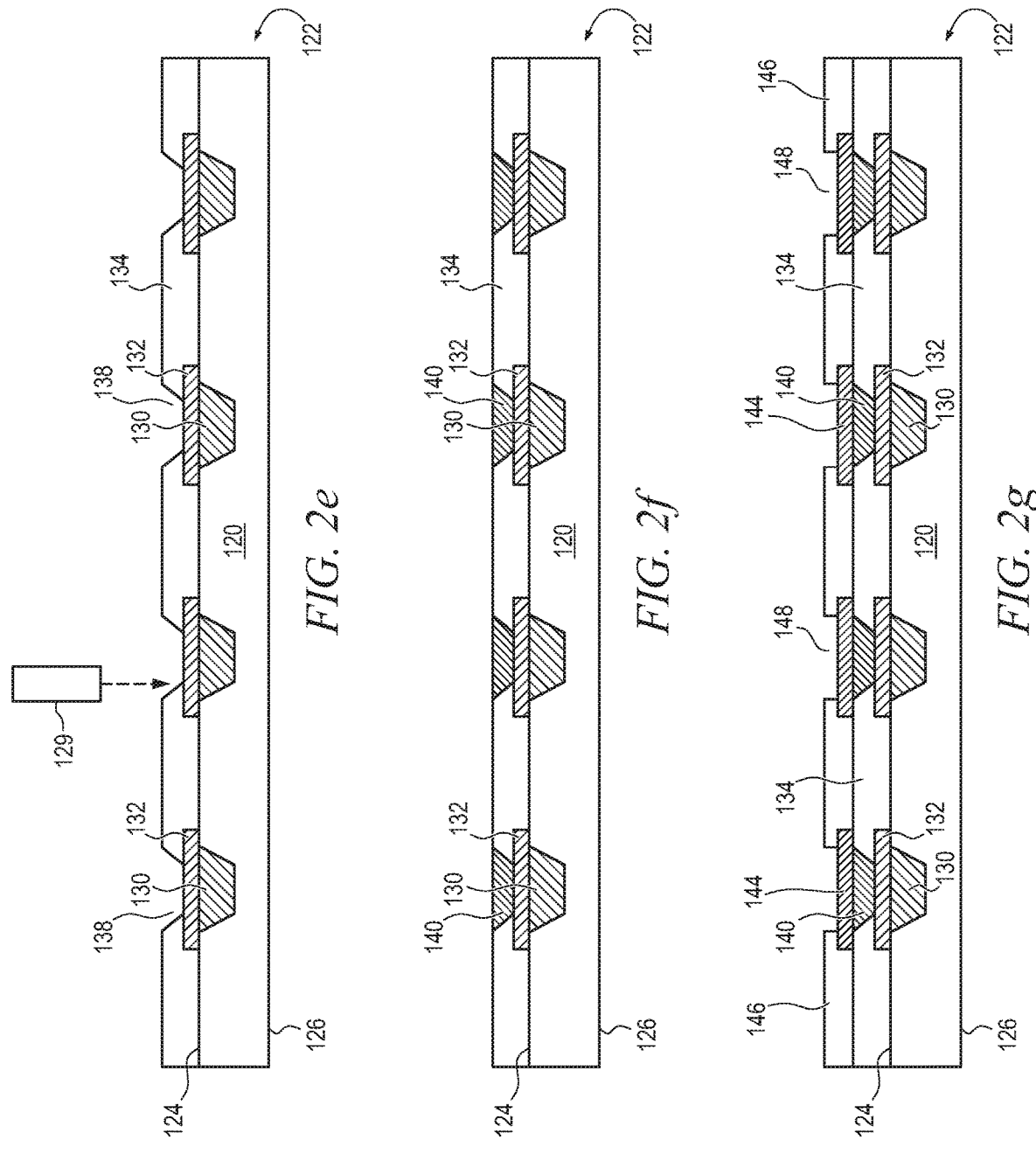

An insulating or passivation layer 134 is formed over conductive layer 132 and surface 124 of core layer 120 using PVD, CVD, printing, lamination, spin coating, spray coating, sintering or thermal oxidation. Insulating layer 134 contains one or more layers of SiO2, Si3N4, SiON, Ta2O5, Al2O3, solder resist, polyimide, BCB, PBO, and other material having similar insulating and structural properties. In one embodiment, insulating layer 134 has a thickness of 64.0 μm. In FIG. 2e, portions of insulating layer 134 are removed using an etching process or LDA with a laser like 129 to form openings or vias 138 extending to conductive layer 132 for further electrical interconnect.

In FIG. 2f, conductive layer 140 is formed within openings 138 using PVD, CVD, electrolytic plating, electroless plating process, or other suitable metal deposition process. Conductive layer 140 can be one or more layers of Al, Cu, Sn, Ni, Au, Ag, or other suitable electrically conductive material. Portions of conductive layer 140 can be electrically common or electrically isolated depending on the design and function of electrical components attached thereto.

In FIG. 2g, conductive layer 144 is formed over conductive layer 140 and insulating layer 134 using PVD, CVD, electrolytic plating, electroless plating process, or other suitable metal deposition process. Conductive layer 144 can be one or more layers of Al, Cu, Sn, Ni, Au, Ag, or other suitable electrically conductive material. Conductive layer 144 operates as a contact pad for later-formed RDL. In one embodiment, conductive layer 144 has a thickness of 24.0±7.0 μm. Portions of conductive layer 144 can be electrically common or electrically isolated depending on the design and function of electrical components attached thereto.

An insulating or passivation layer 146 is formed over conductive layer 144 and insulating layer 134 using PVD, CVD, printing, lamination, spin coating, spray coating, sintering or thermal oxidation. Insulating layer 146 contains one or more layers of SiO2, Si3N4, SiON, Ta2O5, Al2O3, solder resist, polyimide, BCB, PBO, and other material having similar insulating and structural properties. In one embodiment, insulating layer 146 has a thickness of 15.0±7.5 μm. Portions of insulating layer 146 are removed using an etching process or LDA with a laser like 129 to form openings or vias 148 extending to conductive layer 144 for further electrical interconnect.

Figures 2H, 2I, 2J:
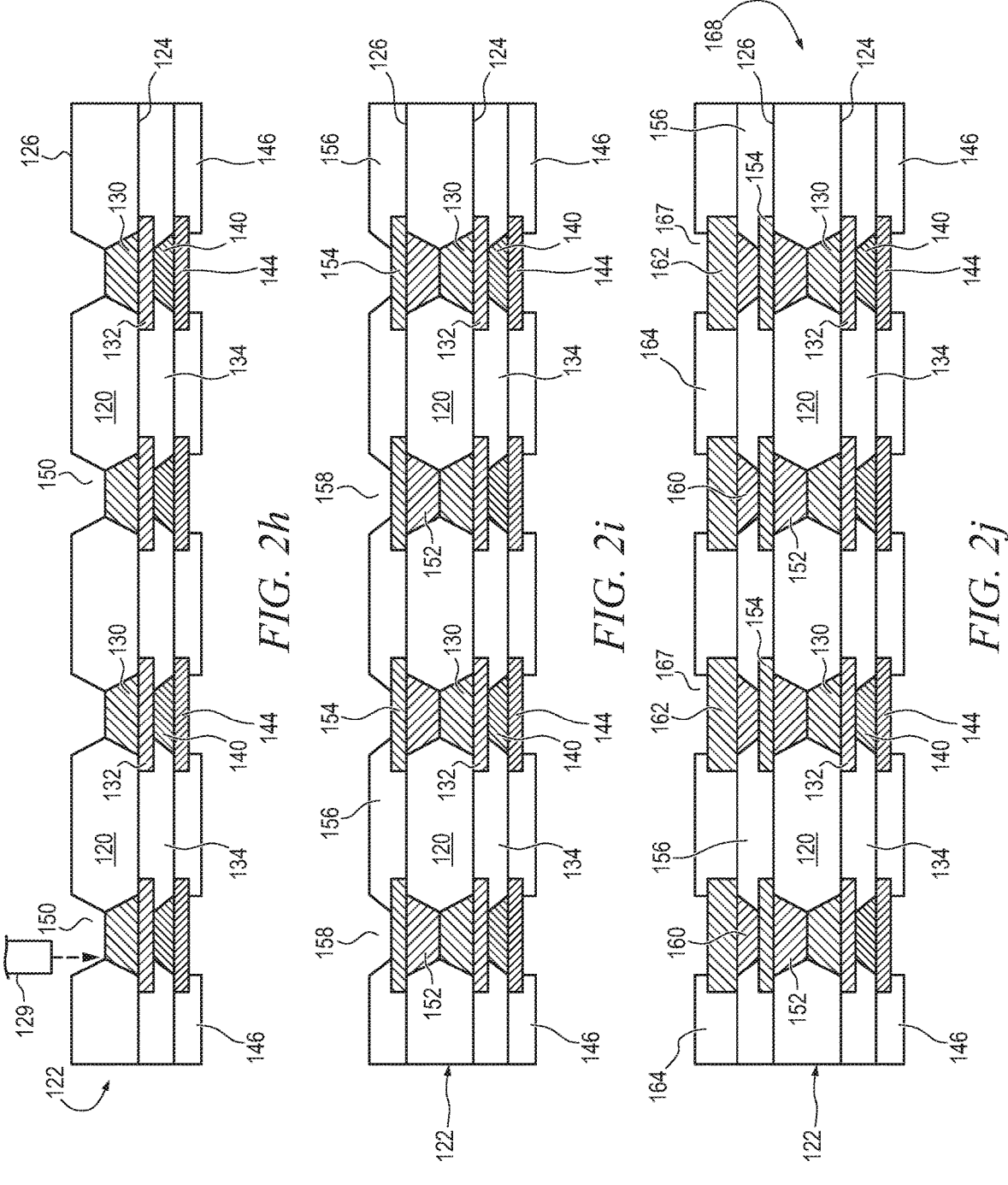

The partial e-bar substrate from FIG. 2g is inverted and opening or via 150 is formed in surface 126 of core layer 120 using an etching process or LDA with a laser like 129 and extending to conductive layer 130, as shown in FIG. 2h.

In FIG. 2i, conductive layer 152 is formed within openings 150, similar to FIG. 2c. Conductive layer 154 is formed over conductive layer 152 and surface 126 of core layer 120, similar to FIG. 2d. In one embodiment, conductive layer 154 has a thickness of 24.0±7.0 μm. An insulating or passivation layer 156 is formed over conductive layer 152 and surface 126 of core layer 120. In one embodiment, insulating layer 156 has a thickness of 24.0±7.0 μm. Portions of insulating layer 156 are removed with a laser like 129 to form openings or vias 158 extending to conductive layer 152 for further electrical interconnect, similar to FIG. 2e.

In FIG. 2j, conductive layer 160 is formed within openings 158, similar to FIG. 2f. Conductive layer 162 is formed over conductive layer 160 and insulating layer 156, similar to FIG. 2g. In particular, conductive layer 162 is made with a thickness of about 40.0 μm or greater, significantly thicker than conductive layers 132, 144, and 154. Conductive layer 162 operates as a contact pad for later-formed bumps. An insulating or passivation layer 164 is formed over conductive layer 160 and insulating layer 156. In one embodiment, insulating layer 164 has a thickness of 15.0±7.5 μm. Portions of insulating layer 164 are removed with a laser like 129 to form openings or vias 167 extending to conductive layer 162 for further electrical interconnect.

Figure 2K:
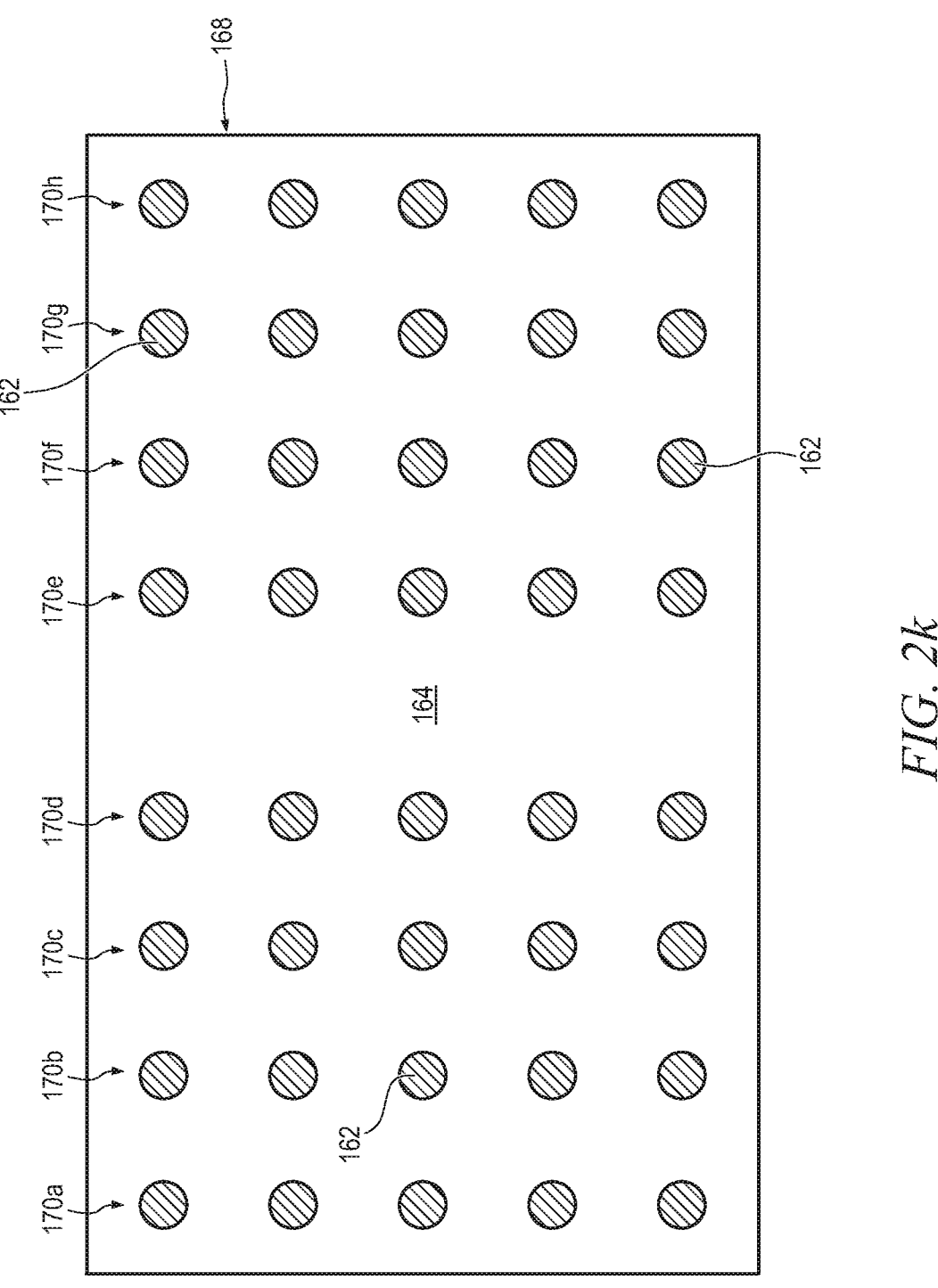
Figure 21:
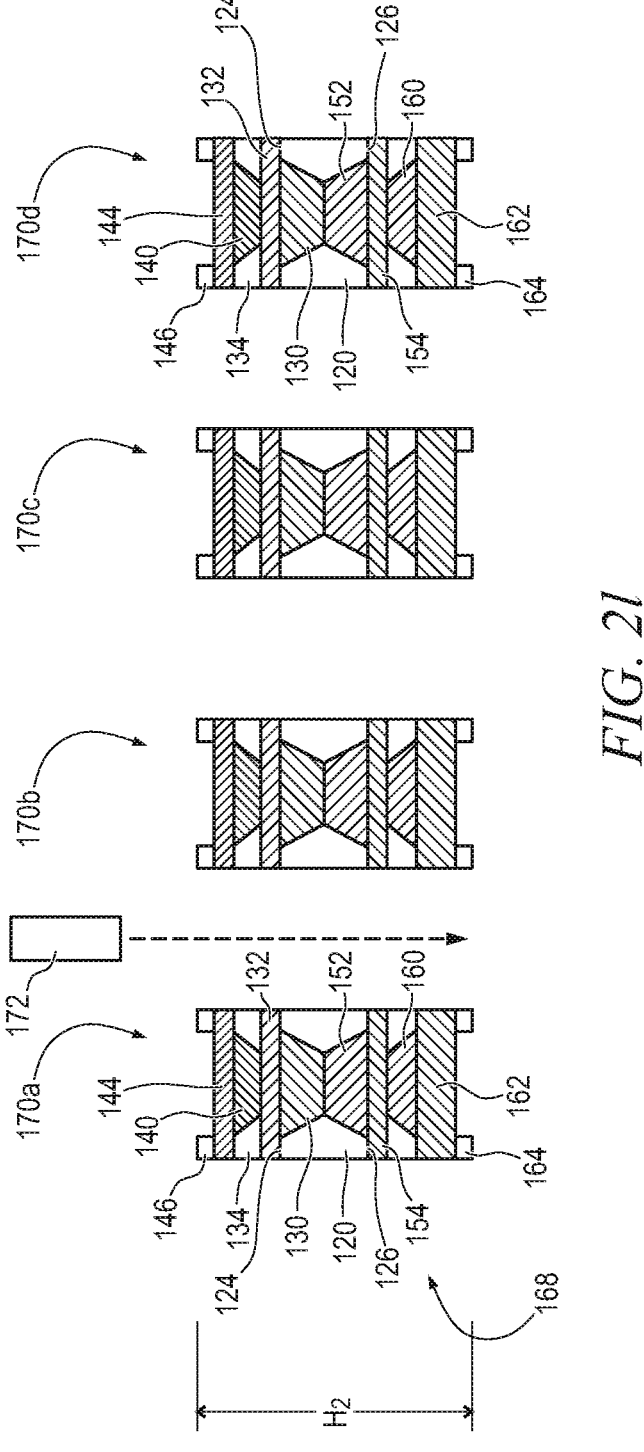

The combination of conductive layers 130, 132, 140, 144, 152, 154, 160, and 162, as well as core layer 120 and insulating layers 134, 146, 156, and 164, constitute e-bar wafer or substrate 168. The conductive layers 130, 132, 140, 144, 152, 154, 160, and 162 provide vertical electrical interconnect through e-bar substrate 168. FIG. 2k is a top view of e-bar substrate 168 with an array of the e-bar structures 170a-170h, visible as conductive layer 162 through insulating layer 164.

In FIG. 2l, e-bar substrate 168 is singulated using a laser cutting tool or saw blade 172, leaving individual e-bar structures 170a-170d. Post singulation, each e-bar structure 170a-170d is made of a portion of conductive layers 130, 132, 140, 144, 152, 154, 160, and 162, as well as core layer 120 and insulating layers 134, 146, 156, and 164, from e-bar substrate 168. In one embodiment, e-bar substrate 170a-170d has a height H2 of 420 μm±35 μm, depending on substrate 120 and package thickness. With core layer 120, e-bar substrate 170a-170d are rigid and generally non-compressible to support an overlaying structure, such as an RDL, as described below.

Figures 3A, 3B, 3C:
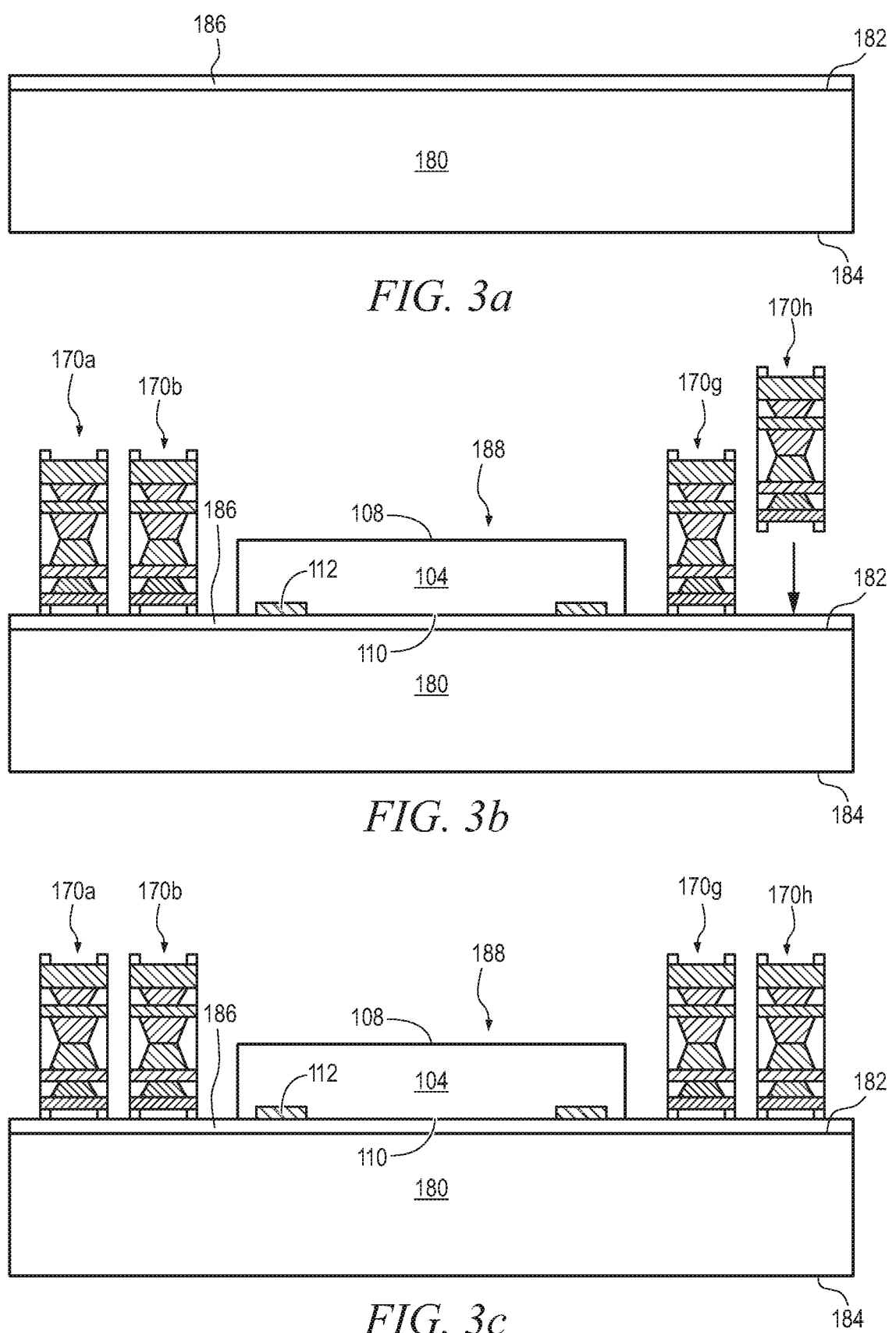
FIGS. 3a-3j illustrate an electrical component with adjacent e-bar structures covered by an encapsulant.

FIG. 3a shows a temporary substrate or carrier 180 containing sacrificial core material, such as silicon, polymer, beryllium oxide, glass, or other suitable low-cost, rigid material for structural support. Substrate 180 has major surface 182 and major surface 184, opposite surface 182. In one embodiment, carrier 120 is a support structure with a temporary bonding layer 186 formed over the carrier. Temporary bonding layer 186 can be a film or foil bonded to surface 182.

In FIG. 3b, electrical component 188 is disposed over surface 182 of substrate 180. Electrical component 188 can be similar to, or made similar to, semiconductor die 104 from FIG. 1c with conductive layer 112 oriented toward surface 182 of substrate 180. Alternatively, electrical component 188 can include other semiconductor die, semiconductor packages, surface mount devices, RF components, discrete electrical devices, or integrated passive devices (IPD).

Figure 3D:
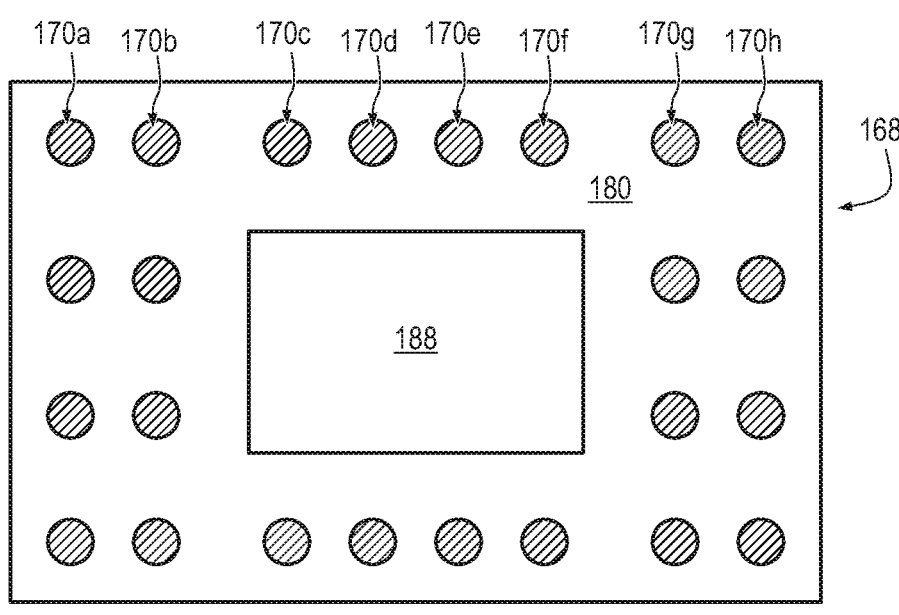

Electrical component 188 is positioned over substrate 180 using a pick and place operation. Electrical component 188 is brought into contact with bonding layer 186. E-bar structures 170a-170d, as well as other e-bar structures like 170e-170h made similar to e-bar structures 170a-170d, are also disposed over and brought into contact with bonding layer 186 around or adjacent to a side of electrical component 188, in a similar manner as is done for the electrical component. FIG. 3c illustrates electrical component 188 and e-bar structures 170a-170h bonded to substrate 180 adjacent to a side of the electrical component. FIG. 3d is a top view of individual e-bar structures 170a-170h formed around or adjacent to a side of electrical component 188 over substrate 180.

Figure 3E:
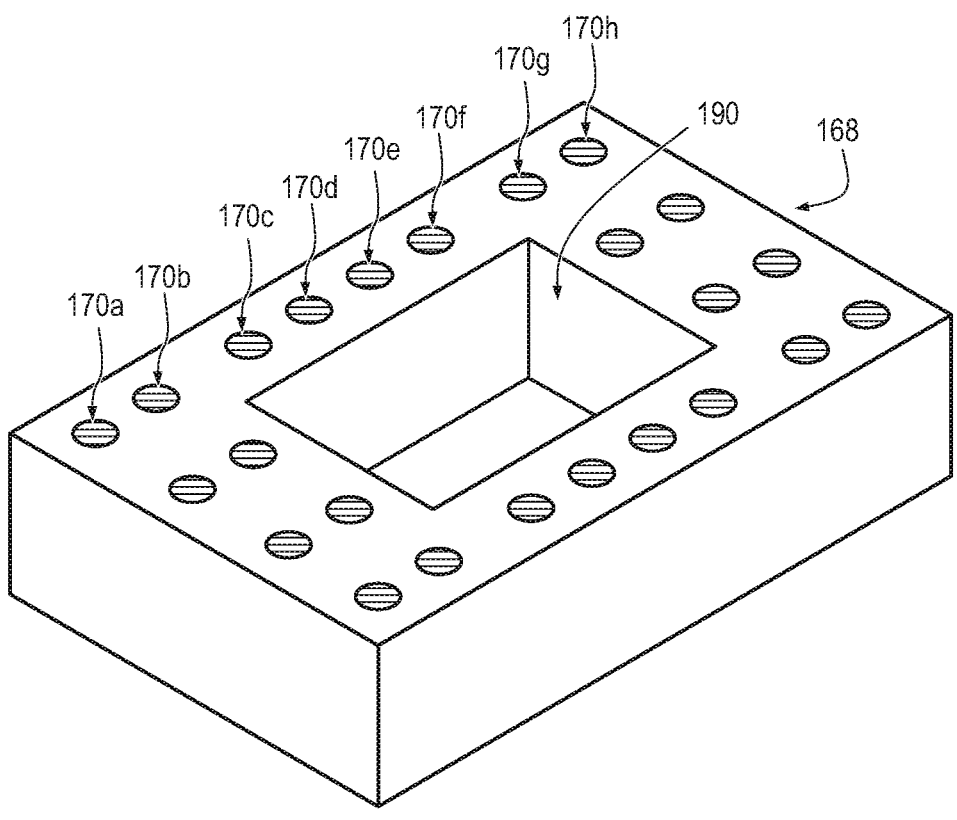

In another embodiment, e-bar substrate 168 from FIGS. 2j-2k is disposed over and brought into contact with bonding layer 186. In this case, the e-bar structures 170a-170h are not singulated into individual units, but rather remain an integral part of e-bar substrate 168, as shown in FIG. 3e. An opening 190 is formed in e-bar substrate 168 to accommodate electrical component 188.

Figure 3F:
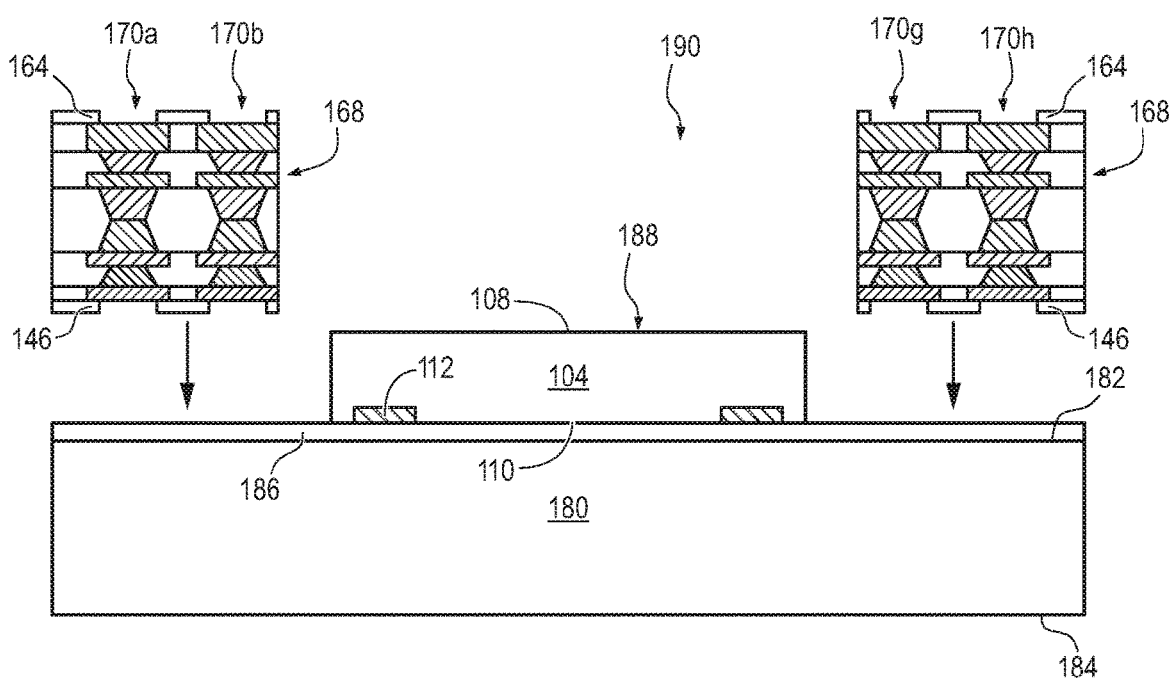
Figure 3G:
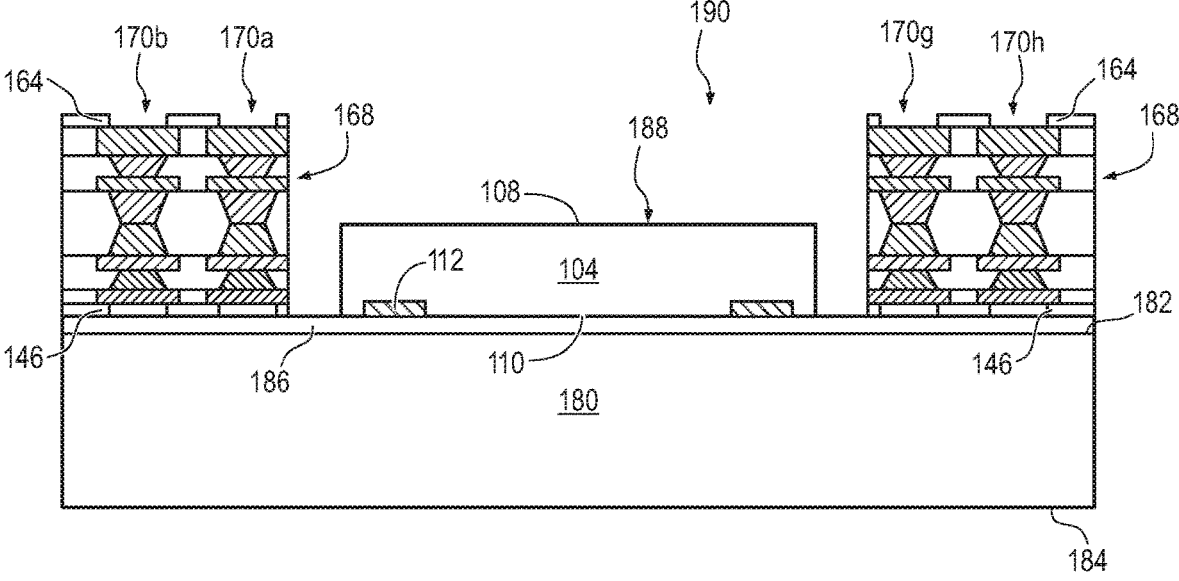
Figure 3H:
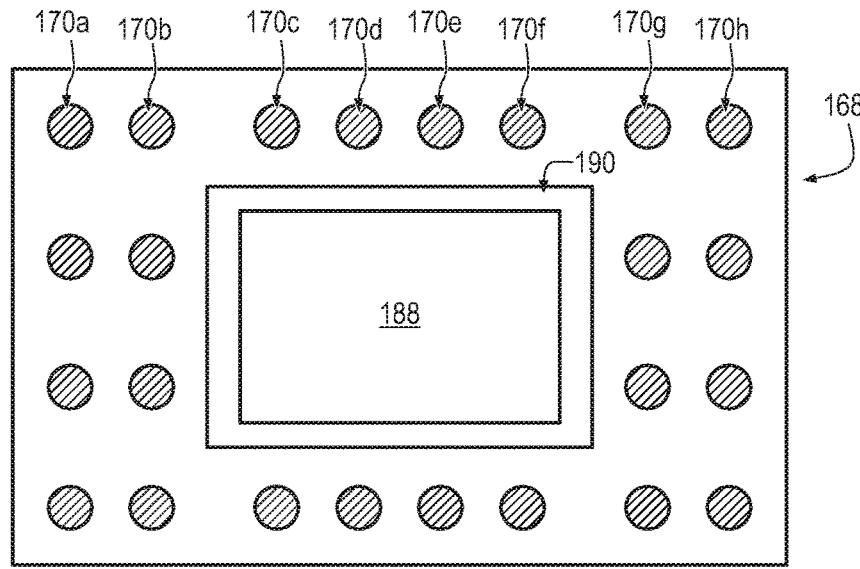

Electrical component 188 is brought into contact with bonding layer 186, similar to FIG. 3b. In FIG. 3f, e-bar substrate 168 is disposed over and brought into contact with bonding layer 186 with electrical component 188 occupying opening 190. FIG. 3g illustrates electrical component 188 and e-bar substrate 168 with integrated e-bar structures 170a-170h bonded to substrate 180. FIG. 3h is a top view of e-bar substrate 168 with integrated e-bar structures 170a-170h disposed around or adjacent to a side of electrical component 188 over substrate 180.

Figure 3I:
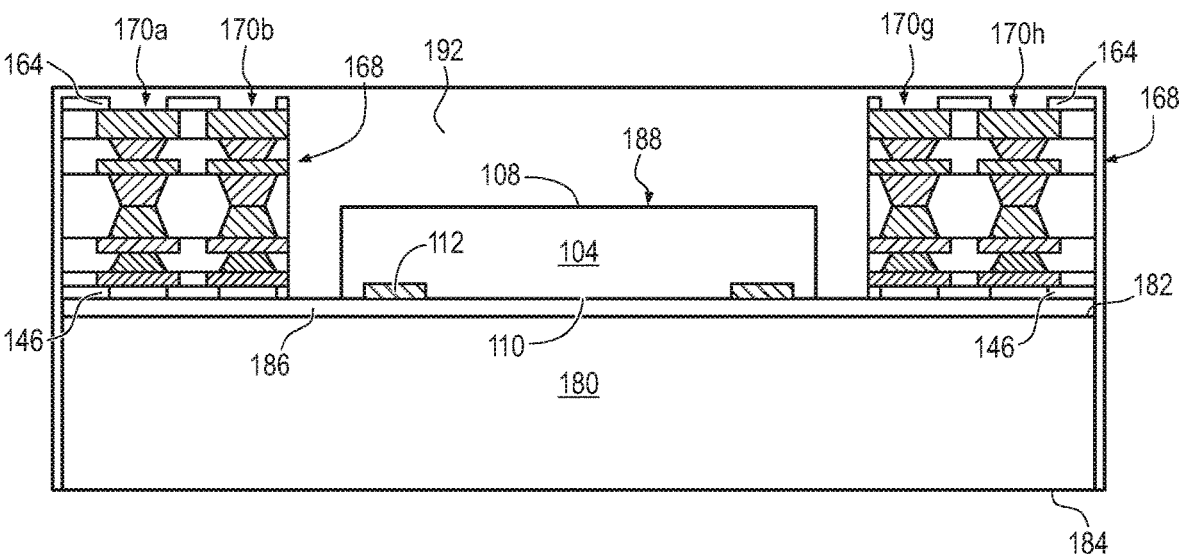

Continuing from FIG. 3c or 3h, encapsulant or molding compound 192 is deposited over and around electrical component 188 and e-bar structures 170a-170h (or e-bar substrate 168) using a paste printing, compressive molding, transfer molding, liquid encapsulant molding, vacuum lamination, spin coating, or other suitable applicator, as shown in FIG. 3i. Encapsulant 192 can be liquid or granular polymer composite material, such as epoxy resin with filler, epoxy acrylate with filler, or polymer with proper filler. Encapsulant 192 is non-conductive, provides structural support, and environmentally protects the semiconductor device from external elements and contaminants.

Figures 3J, 4A, 4B:
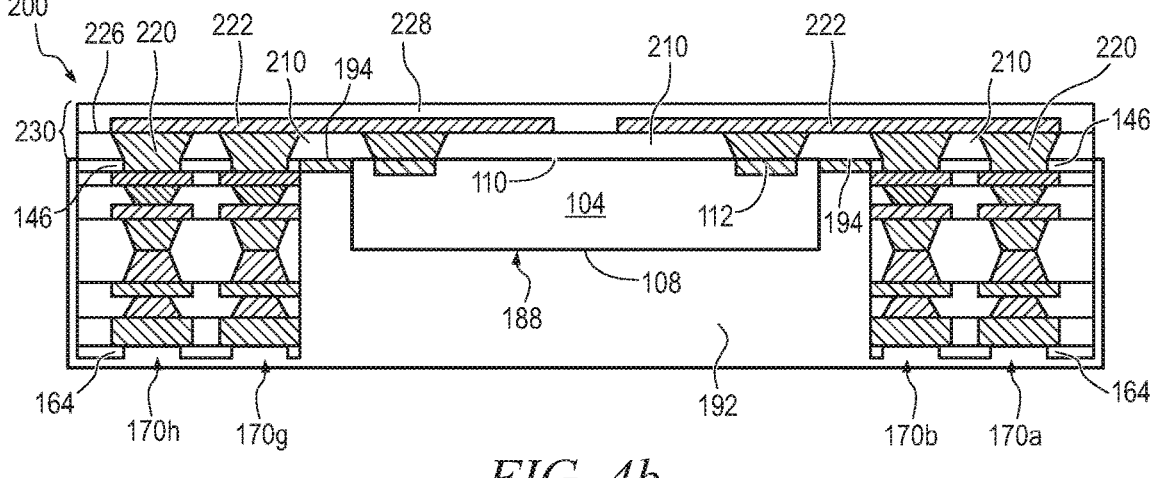
FIGS. 4a-4e illustrate a process of forming an embedded wafer level ball grid array.

In FIG. 3j, carrier 180 and bonding layer 186 are removed by chemical etching, chemical mechanical polishing (CMP), mechanical peel-off, mechanical grinding, thermal bake, ultra-violet (UV) light, or wet stripping to expose conductive layer 112 of electrical component 188, conductive layer 144 of e-bar structures 170a-170h, and surface 194 of encapsulant 192. Reconstituted embedded wafer level package (eWLP) 200, comprising electrical component 188, e-bar structures 170a-170h, and encapsulant 192, is ready for a multi-layer RDL buildup interconnect structure over surface 110 of electrical component 188, surface 194 of encapsulant 192, and conductive layer 112 to provide electrical interconnect for the semiconductor die, as well as external electrical components. Reconstituted eWLP 200 operates as a substrate to form the multi-layer RDL buildup interconnect structure.

FIGS. 4a-4e illustrate formation of a multi-redistribution layer (RDL) interconnect structure. In FIG. 4a, eWLP 200 is inverted and insulating or passivation layer 210 is formed over surface 194 and conductive layer 112 using PVD, CVD, printing, lamination, spin coating, spray coating, sintering or thermal oxidation. Insulating layer 210 contains one or more layers of $SiO_2$, $Si_3N_4$, SiON, $Ta_2O_5$, $Al_2O_3$, solder resist, polyimide, BCB, PBO, and other material having similar insulating and structural properties. Portions of insulating layer 210 are removed using an etching process or LDA with laser 214 to form openings or vias 218 extending to conductive layers 112 and 144 for further electrical interconnect.

In FIG. 4b, conductive layer 220 is formed in vias 218 using PVD, CVD, electrolytic plating, electroless plating process, or other suitable metal deposition process. Conductive layer 220 can be one or more layers of Al, Cu, Sn, Ni, Au, Ag, or other suitable electrically conductive material. Portions of conductive layer 220 can be electrically common or electrically isolated depending on the design and function of semiconductor die 104 and other electrical components attached thereto.

Conductive layer 222 is formed over surface 226 of insulating layer 210 and conductive layer 220 using PVD, CVD, electrolytic plating, electroless plating process, or other suitable metal deposition process. Conductive layer 222 can be one or more layers of Al, Cu, Sn, Ni, Au, Ag, or other suitable electrically conductive material. Conductive layer 222 is an RDL as it redistributes the electrical signal across and over semiconductor die 104 and encapsulant 192. Portions of conductive layer 222 can be electrically common or electrically isolated depending on the design and function of semiconductor die 104 and other electrical components attached thereto.

An insulating or passivation layer 228 is formed over insulating layer 210 and conductive layer 222 using PVD, CVD, printing, lamination, spin coating, spray coating, sintering or thermal oxidation. Insulating layer 228 contains one or more layers of $SiO_2$, $Si_3N_4$, SiON, $Ta_2O_5$, $Al_2O_3$, solder resist, polyimide, BCB, PBO, and other material having similar insulating and structural properties. Additional conductive layers like 220 and 222 and insulating layers 228 can be formed as well to constitute multi-layer RDL 230.

Figures 4C, 4D, 4E:
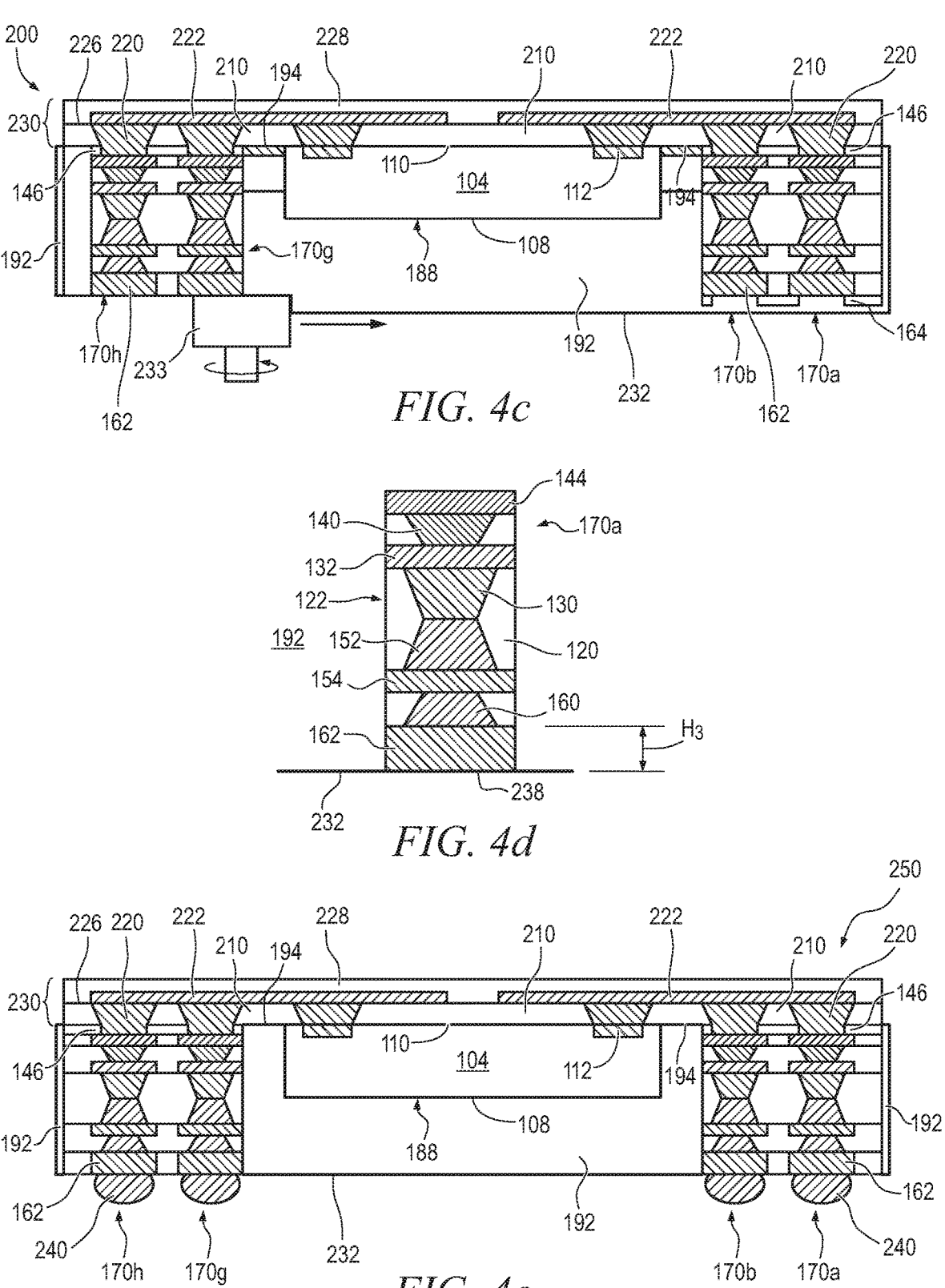

In FIG. 4c, surface 232 of encapsulant 192 undergoes a grinding operation with grinder 233 to planarize surface 232, surface 238 of conductive layer 162, and insulating layer 164. In one embodiment, grinder 233 removes about 25.0 μm of material from conductive layer 162. Accordingly, there should be a height H3 of 10.0-15.0 μm of conductive layer 162 remaining post grinding. FIG. 4d shows the planarized surface 232 of encapsulant 190 and surface 238 of conductive layer 162.

In FIG. 4e, an electrically conductive bump material is deposited over conductive layer 162 using an evaporation, electrolytic plating, electroless plating, ball drop, or screen printing process. The bump material can be Al, Sn, Ni, Au, Ag, Pb, Bi, Cu, solder, and combinations thereof, with an optional flux solution. For example, the bump material can be eutectic Sn/Pb, high-lead solder, or lead-free solder. The bump material is bonded to conductive layer 162 using a suitable attachment or bonding process. In one embodiment, the bump material is reflowed by heating the material above its melting point to form balls or bumps 240. In one embodiment, bump 240 is formed over an under bump metallization (UBM) having a wetting layer, barrier layer, and adhesive layer. Bump 240 can also be compression bonded or thermocompression bonded to conductive layer 162. Bump 240 represents one type of interconnect structure that can be formed over conductive layer 162. The interconnect structure can also use bond wires, conductive paste, stud bump, micro bump, or other electrical interconnect.

The combination of inverted (active surface 110 oriented away from bumps 240) electrical component 188, e-bar structures 170a-170h, encapsulant 192, RDL 230, and bumps 240 constitute embedded wafer level ball grid array (eWLB) 250. Again, conductive layer 162 is made about 40.0 μm or greater in thickness, i.e., substantially thicker than conductive layers 132, 144, and 154, to avoid grinding away the contact point for bumps 240, which would lead to yield loss at ball drop process. Conductive layer 162 should retain at least 10.0-15.0 μm of thickness post grinding. The extra thickness for conductive layer 162 ensures full exposure of surface 238 and improves ball drop yield. The extra thickness of conductive layer 162 is compatible with a wide range of process parameters. The full exposure of conductive layer 162 provides greater reliability testing performance.

Figure 5:
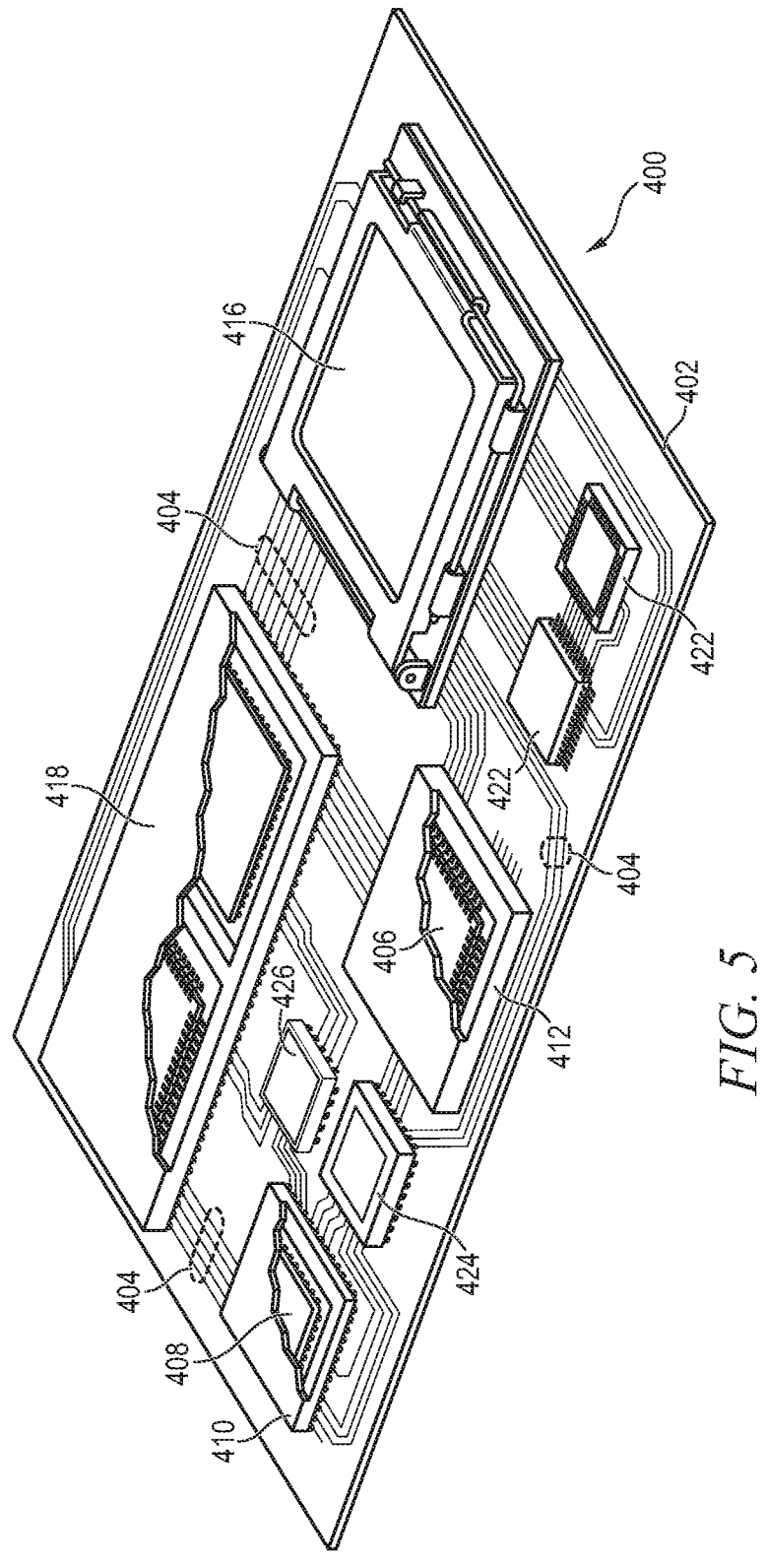

FIG. 5 illustrates electrical device 400 having a chip carrier substrate or PCB 402 with a plurality of semiconductor packages disposed on a surface of PCB 402, including eWLB 250. Electrical device 400 can have one type of semiconductor package, or multiple types of semiconductor packages, depending on the application.

Electrical device 400 can be a stand-alone system that uses the semiconductor packages to perform one or more electrical functions. Alternatively, electrical device 400 can be a subcomponent of a larger system. For example, electrical device 400 can be part of a tablet, cellular phone, digital camera, communication system, or other electrical device. Alternatively, electrical device 400 can be a graphics card, network interface card, or other signal processing card that can be inserted into a computer. The semiconductor package can include microprocessors, memories, ASIC, logic circuits, analog circuits, RF circuits, discrete devices, or other semiconductor die or electrical components. Miniaturization and weight reduction are essential for the products to be accepted by the market. The distance between semiconductor devices may be decreased to achieve higher density.

In FIG. 5, PCB 402 provides a general substrate for structural support and electrical interconnect of the semiconductor packages disposed on the PCB. Conductive signal traces 404 are formed over a surface or within layers of PCB 402 using evaporation, electrolytic plating, electroless plating, screen printing, or other suitable metal deposition process. Signal traces 404 provide for electrical communication between each of the semiconductor packages, mounted components, and other external system components. Traces 404 also provide power and ground connections to each of the semiconductor packages.

In some embodiments, a semiconductor device has two packaging levels. First level packaging is a technique for mechanically and electrically attaching the semiconductor die to an intermediate substrate. Second level packaging involves mechanically and electrically attaching the intermediate substrate to the PCB. In other embodiments, a semiconductor device may have the first level packaging where the die is mechanically and electrically disposed directly on the PCB. For the purpose of illustration, several types of first level packaging, including bond wire package 406 and flipchip 408, are shown on PCB 402. Additionally, several types of second level packaging, including ball grid array (BGA) 410, bump chip carrier (BCC) 412, land grid array (LGA) 416, multi-chip module (MCM) or SIP module 418, quad flat non-leaded package (QFN) 420, quad flat package 422, embedded wafer level ball grid array (eWLB) 424, and wafer level chip scale package (WLCSP) 426 are shown disposed on PCB 402. In one embodiment, eWLB 424 is a fan-out wafer level package (Fo-WLP) and WLCSP 426 is a fan-in wafer level package (Fi-WLP). Depending upon the system requirements, any combination of semiconductor packages, configured with any combination of first and second level packaging styles, as well as other electrical components, can be connected to PCB 402. In some embodiments, electrical device 400 includes a single attached semiconductor package, while other embodiments call for multiple interconnected packages. By combining one or more semiconductor packages over a single substrate, manufacturers can incorporate pre-made components into electrical devices and systems. Because the semiconductor packages include sophisticated functionality, electrical devices can be manufactured using less expensive components and a streamlined manufacturing process. The resulting devices are less likely to fail and less expensive to manufacture resulting in a lower cost for consumers.

While one or more embodiments of the present invention have been illustrated in detail, the skilled artisan will appreciate that modifications and adaptations to those embodiments may be made without departing from the scope of the present invention as set forth in the following claims.

What is claimed:

1. A semiconductor device, comprising:
an electrical component;
an e-bar structure disposed to a side of the electrical component, wherein the e-bar structure includes,
(a) a core layer,
(b) a first single conductive layer formed over a first surface of the core layer and having a thickness in a range of 17.0-30.0 micrometers, and
(c) a second single conductive layer formed over a second surface of the core layer and having a thickness of at least 40.0 micrometers, wherein the thickness of the second single conductive layer is at least 10.0 micrometers greater than the thickness of the first single conductive layer;
an encapsulant deposited over the electrical component and e-bar structure; and
a redistribution layer (RDL) formed over the electrical component, encapsulant, and e-bar structure.

2. The semiconductor device of claim 1, wherein the RDL includes:
an insulating layer formed over the electrical component and encapsulant; and
a conductive layer formed over the insulating layer.

3. The semiconductor device of claim 1, further including a bump formed over a contact pad of the second single conductive layer of the e-bar structure opposite the RDL.

4. The semiconductor device of claim 3, wherein the contact pad includes a thickness of 40 micrometers or greater.

5. The semiconductor device of claim 3, wherein a contact pad of the electrical component is electrically connected to the RDL opposite the bump.

6. A semiconductor device, comprising:
an electrical component;
an e-bar structure disposed adjacent to the electrical component, wherein the e-bar structure includes,
(a) a core layer,
(b) a first conductive layer formed over a first surface of the core layer and having a thickness in a range of 17.0-30.0 micrometers, and
(c) a second conductive layer formed over a second surface of the core layer and having a thickness of at least 40.0 micrometers, wherein the thickness of the second single conductive layer is greater than the thickness of the first conductive layer; and
a redistribution layer (RDL) formed over the electrical component and e-bar structure.

7. The semiconductor device of claim 6, further including an encapsulant deposited over the electrical component and e-bar structure.

8. The semiconductor device of claim 6, wherein the RDL includes:
an insulating layer formed over the electrical component; and
a conductive layer formed over the insulating layer.

9. The semiconductor device of claim 6, further including a bump formed over a contact pad of the second conductive layer of the e-bar structure opposite the RDL.

10. The semiconductor device of claim 9, wherein the contact pad includes a thickness of 40 micrometers or greater.

11. The semiconductor device of claim 9, wherein a contact pad of the electrical component is electrically connected to the RDL opposite the bump.

12. A method of making a semiconductor device, comprising:
providing an electrical component;
disposing an e-bar structure to a side of the electrical component by,
(a) providing a core layer,
(b) forming a first single conductive layer over a first surface of the core layer and having a thickness in a range of 17.0-30.0 micrometers, and (c) forming a second single conductive layer over a second surface of the core layer and having a thickness of at least 40.0 micrometers, wherein the thickness of the second single conductive layer is at least 10.0 micrometers greater than the thickness of the first single conductive layer;
depositing an encapsulant over the electrical component and e-bar structure; and
forming a redistribution layer (RDL) over the electrical component, encapsulant, and e-bar structure.

13. The method of claim 12, wherein forming the RDL includes:
forming an insulating layer over the electrical component and encapsulant; and
forming a conductive layer over the insulating layer.

14. The method of claim 12, further including forming a bump over a contact pad of the second single conductive layer of the e-bar structure opposite the RDL.

15. The method of claim 14, wherein the contact pad includes a thickness of 40 micrometers or greater.

16. The method of claim 14, wherein a contact pad of the electrical component is electrically connected to the RDL opposite the bump.

17. A method of making a semiconductor device, comprising:
providing an electrical component;
disposing an e-bar structure adjacent to the electrical component by,
(a) providing a core layer,
(b) forming a first conductive layer over a first surface of the core layer and having a thickness in a range of 17.0-30.0 micrometers, and
(c) forming a second conductive layer over a second surface of the core layer and having a thickness of at least 40.0 micrometers, wherein the thickness of the second single conductive layer is greater than the thickness of the first conductive layer; and
forming a redistribution layer (RDL) over the electrical component and e-bar structure.

18. The method of claim 17, further including depositing an encapsulant over the electrical component and e-bar structure.

19. The method of claim 17, wherein forming the RDL includes:
forming an insulating layer over the electrical component; and
forming a conductive layer formed over the insulating layer.

20. The method of claim 17, further including forming a bump over a contact pad of the second conductive layer of the e-bar structure opposite the RDL.

21. The method of claim 20, wherein a contact pad of the electrical component is electrically connected to the RDL opposite the bump.

* * * * *